United States Patent [19]

Hu et al.

[11] Patent Number: 5,932,363

[45] Date of Patent: *Aug. 3, 1999

[54] ELECTROLUMINESCENT DEVICES

[75] Inventors: Nan-Xing Hu, Oakville; Shuang Xie, Mississauga; Zoran D. Popovic, Mississauga; Beng S. Ong, Mississauga; Ah-Mee Hor, Mississauga, all of Canada

[73] Assignee: Xerox Corporation, Stamford, Conn.

[*] Notice: This patent is subject to a terminal disclaimer.

[21] Appl. No.: 08/942,647

[22] Filed: Oct. 2, 1997

[51] Int. Cl.$^6$ .............................. B32B 9/00; H05B 33/12; C09K 11/08

[52] U.S. Cl. .................................... 428/690; 252/301.4 R; 252/301.16; 252/301.22; 252/301.23; 428/691; 428/917; 313/502; 313/503; 313/504; 548/100; 548/103; 548/136; 548/143; 556/118; 556/121; 556/170

[58] Field of Search ..................................... 428/690, 691, 428/917; 252/301.16, 301.22, 301.23, 301.4 R; 313/504, 503, 502; 564/305; 548/100, 103, 143, 136; 556/118, 121, 170

[56] References Cited

U.S. PATENT DOCUMENTS

| | | | |
|---|---|---|---|
| 3,172,862 | 3/1965 | Gurnee et al. | 252/301.3 |
| 3,530,325 | 9/1970 | Mehl et al. | 313/108 |
| 4,356,429 | 10/1982 | Tang | 313/503 |
| 4,539,507 | 9/1985 | VanSlyke et al. | 313/504 |
| 4,720,432 | 1/1988 | VanSlyke et al. | 428/457 |
| 4,769,292 | 9/1988 | Tang et al. | 428/690 |
| 4,950,950 | 8/1990 | Perry et al. | 313/504 |
| 5,150,006 | 9/1992 | Van Slyke et al. | 313/504 |
| 5,420,288 | 5/1995 | Ohta et al. | 548/145 |
| 5,487,953 | 1/1996 | Shirota et al. | 428/690 |
| 5,516,577 | 5/1996 | Matsuura et al. | 428/212 |
| 5,593,788 | 1/1997 | Shi et al. | 428/690 |
| 5,652,067 | 7/1997 | Ito et al. | 428/690 |
| 5,716,722 | 2/1998 | Hamada et al. | 428/690 |

*Primary Examiner*—Shailendra Kumar
*Attorney, Agent, or Firm*—E. O. Palazzo

[57] ABSTRACT

A luminescent composition containing a mixture of a fluorescent material and a metal chelate compound of the formula $$L_n\text{---}M^{+n} \qquad (I)$$

wherein M represents a metal; n is a number of from 1 to 3, and L is a ligand of the formula

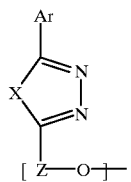

(II)

wherein Ar is an aryl; X is selected from the group consisting of oxygen, sulfur, and selenium; N is nitrogen; O is oxygen, and Z is a suitable aromatic component.

33 Claims, 1 Drawing Sheet

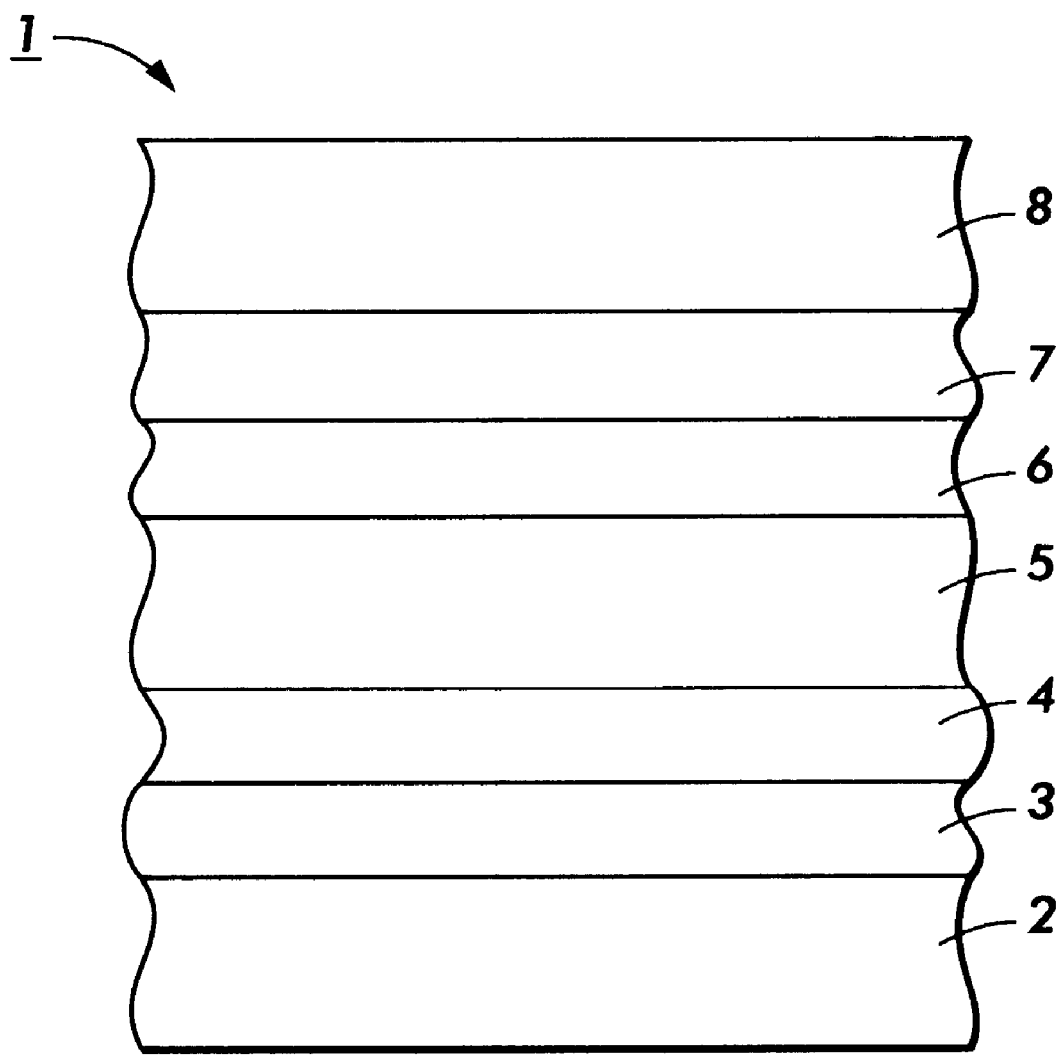

ELECTROLUMINESCENT DEVICES

PENDING APPLICATIONS AND PATENTS

There are illustrated in copending applications U.S. Ser. No. 942,598, U.S. Ser. No. 942,882, and U.S. Ser. No. 942,752, filed concurrently herewith, the disclosures of which are totally incorporated herein by reference, EL devices containing, for example, indolocarbazoles, amines thereof, and processes thereof.

Also, disclosed in U.S. Pat. No. 5,763,110; U.S. Ser. No. 707,260; U.S. Ser. No. 807,488; U.S. Ser. No. 807,489; U.S. Ser. No. 807,510, the disclosures of each being totally incorporated herein by reference, are EL devices.

In copending patent application U.S. Ser. No. 829,398, the disclosure of which is totally incorporated herein by reference, there are illustrated EL devices with metal chelates of, for example, 1,3,4-oxadiazoles. EL devices with these chelates may possess a limited emission spectrum, low extended EL efficiency, and difficulties in achieving longer emission colors such as red.

The appropriate components of the copending applications, such as the substrates, anodes, cathodes, metal chelates, method of preparation, and the like, can be selected for the EL devices of the present invention in embodiments thereof.

BACKGROUND OF THE INVENTION

This invention is directed to organic electroluminescent (EL) devices, and more specifically, to energy-efficient organic EL devices with enhanced operational stability and improved performance characteristics. Organic EL devices are desired that are capable of providing high luminescence at low driving voltages, excellent device stability, and extended life span. The organic EL devices of the present invention enable in embodiments the aforementioned characteristics, and these EL devices can be selected for use in flat-panel emissive display technologies, including TV screens, computer screens, and the like, and as image bar components for digital copiers and printers. More specifically, the present invention relates to organic EL devices with improved charge injection characteristics, low operation voltages, and which devices are, for example, capable of emitting light with uniform and sufficient luminance, and which devices utilize an organic luminescent composition.

PRIOR ART

A simple organic EL device is comprised of a layer of organic luminescent material conductively sandwiched between an anode, typically comprised of a transparent conductor, such as indium tin oxide, and a cathode, typically a low work function metal such as magnesium, calcium, aluminum, or the alloys thereof with other metals. The EL device functions on the principle that under an electric field, positive charges (holes) and negative charges (electrons) are respectively injected from the anode and cathode into the luminescent layer and undergo recombination to form excitonic states which subsequently emit light. Prior art organic EL devices have been constructed from a laminate of an organic luminescent material and electrodes of opposite polarity, which devices include a single crystal material, such as single crystal anthracene, as the luminescent substance as described, for example, in U.S. Pat. No. 3,530,325. However, these devices require excitation voltages on the order of 100 volts or greater. Subsequent modifications of organic EL device structure through incorporation of additional layers, such as charge injecting and charge transporting layers, may result in performance improvements.

In the prior art, an organic EL device with a multilayer structure can be formed as a dual layer structure comprising one organic layer adjacent to the anode supporting hole transport, and another organic layer adjacent to the cathode supporting electron transport and acting as the organic luminescent zone of the device. Another alternate device configuration is comprised of three separate layers, a hole transport layer, a luminescent layer, and an electron transport layer, which layers are laminated in sequence and are sandwiched between an anode and a cathode. Optionally, a fluorescent dopant material can be added to the emission zone or layer whereby the recombination of charges results in the excitation of the fluorescent dopant material, thereby resulting in improved device performance characteristics such as luminescence efficiency and emission color.

In U.S. Pat. No. 4,539,507 there is disclosed an EL device formed of a conductive glass transparent anode, a hole transporting layer of 1,1-bis(4-p-tolylaminophenyl) cyclohexane, an electron transporting layer of 4,4'-(5,7-di-tert-pentyl-2-benzoxlyl)stilben, and an indium cathode.

U.S. Pat. No. 4,720,432 discloses an improved organic EL device comprising a dual-layer hole injecting and transporting zone, one layer being comprised of porphyrinic compounds supporting hole injection and the other layer being comprised of aromatic tertiary amine compounds supporting hole transport.

U.S. Pat. No. 4,769,292 discloses an EL device employing a luminescent zone comprised of an organic host material capable of sustaining hole-electron recombination and a fluorescent dye material capable of emitting light in response to energy released by hole-electron recombination. A preferred host material is an aluminum complex of 8-hydroxyquinoline, namely tris(8-hydroxyquinolinate) aluminum.

While recent progress in organic EL research has elevated the potential of organic EL devices for widespread applications, the performance levels of current available devices are still below expectations and require improvement. Further, for visual display applications, organic luminescent materials should provide a satisfactory color in the visible spectrum, normally with emission maxima at about 460, 550 and 630 nanometers for blue, green and red. In most conventional organic EL devices, the luminescent zone or layer is formed of a green-emitting luminophor of tris(8-hydroxyquinolinate)aluminum with certain fluorescent materials. Although there have been several disclosures describing blue-emitting organic EL devices, their performance characteristics still possess many disadvantages such as poor emission hue, high operation voltages, low luminance, and poor operation stability. Thus, there continues to be a need for improved luminescent compositions for organic EL devices, which are vacuum evaporable and form thin films with excellent thermal stability. Specifically, there is a need for luminescent compositions which are capable of providing light emission in the visible spectrum spreading from blue to red colors. Further, there is a need for luminescent host materials which can be co-deposited with a fluorescent dopant to form a luminescent zone, enabling the emission of satisfactory color and improvements in device operation performance.

SUMMARY OF THE INVENTION

It is a feature of the present invention to provide luminescent compositions for organic EL devices.

It is another feature of the present invention to provide organic EL devices with many advantages such as low operation voltages, uniform light emission with spectrum spreading from blue to longer wavelengths, and improved electroluminescent efficiency.

In yet another feature of the present invention there is provided an organic EL device containing a light emitting layer comprised of a 1,3,4-oxadiazole chelate compound as a host component capable of sustaining hole-electron recombination and a fluorescent material capable of emitting light in response to energy released by the hole-electron recombination.

Further, in a feature of the present invention there is provided an organic EL device comprised of a supporting substrate of, for example, glass, an anode, an optional buffer layer, a vacuum deposited organic hole transporting layer comprised of, for example, an aromatic tertiary amine, a vacuum deposited light emitting metal chelate (I) layer, an optional vacuum deposited electron transporting layer, and in contact therewith a low work function metal, such as magnesium and its alloys as a cathode, wherein the light emitting layer is comprised of a mixture of metal chelate compound as a host component and a fluorescent material.

In embodiments, the present invention relates to luminescent compositions comprised of metal chelate compounds (I) prepared as illustrated in copending application U.S. Ser. No. 829,398, the disclosure of which is totally incorporated herein by reference, as the luminescent components and blended therewith certain fluorescent materials, and wherein the metal chelate compounds are illustrated by the formula

$$L_n—M^{+n} \quad (I)$$

wherein M represents a metal, n is a number of, for example, from 1 to 3, and L is a ligand represented by Formula (II):

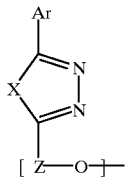

(II)

wherein Ar is an aryl group containing, for example, 6 to about 30 carbon atoms, or an aromatic heterocyclic group such as pyridyl, quinolyl, thienyl, oxadiazolyl, and the like; X is selected from the group consisting of oxygen, sulfur, and selenium; N is nitrogen, O is oxygen, and Z is a suitable aromatic component, such as 1,2-phenylene, 1,2-naphthylene, 2,3-naphthylene, 3,4-pyridinediyl, 3,4-quinolinediyl, and their substituted analogs with the substituents being preferably selected from the group consisting of alkyl groups with 1 to about 5 carbon atoms, phenyl, aryl groups having a substituent of halogen, alkyl, or alkoxy with 1 to 5 carbons, halogen, alkoxy groups containing 1 to 3 carbon atoms, a carboxy group, a cyano group, and the like.

The metal chelate compounds, such as the 1,3,4-oxadiozoles, possess several advantages. For example, the compounds exhibit the ability of forming thin films with excellent thermal stability by vacuum evaporation; and they can be blended with a broad scope of fluorescent materials to form a common phase.

In embodiments, the present invention relates to organic EL devices that are comprised in the following order of a supporting substrate of, for example, glass, an anode, an optional buffer layer, an organic hole transporting layer, an organic light emitting layer, and an optional electron transporting layer, and in contact therewith a low work function metal as a cathode, wherein the light emitting layer contains a luminescent composition comprised of a metal chelate compound illustrated by Formula (I) as a host component capable of sustaining hole-electron recombination and a fluorescent material capable of emitting light in response to energy released by the hole-electron recombination. The light emitting layer may be formed by vacuum deposition from simultaneous evaporation of the host material and the fluorescent material. The presence of the fluorescent material permits a wide latitude of wavelengths of light emission and may enable the enhancement of electroluminescent efficiency and improvements in device operation stability.

FIGURE

There is illustrated in the FIGURE an EL device of the present invention.

DESCRIPTION OF EMBODIMENTS

The embodiments of the present invention will be described in more details with reference to the schematic diagram of EL devices as depicted in the FIGURE.

The FIGURE illustrates an EL device or an organic light emitting diode 1 comprised of a supporting substrate 2 of, for example, glass, an anode 3, an optional buffer layer 4, an organic hole transporting layer 5, an organic metal chelate fluorescent light emitting layer 6, and an electron transporting layer 7, and in contact therewith a low work function metal as a cathode 8. In operation, when the anode is electrically biased to a positive potential with respect to the cathode, holes are injected into the organic hole transporting layer and transported across this layer to the light emitting layer. Concurrently electrons are injected from the cathode into the electron transporting layer and are transported toward the light emitting layer. Recombination of holes and electron occurs in the light emitting layer, resulting in light emission.

Embodiments of the present invention include a luminescent composition comprised of a mixture containing a fluorescent material and a metal chelate compound of the formula

$$L_n—M^{+n} \quad (I)$$

wherein M represents a metal, n is a number of from 1 to 3, and L is a ligand of the formula

(II)

wherein Ar is an aryl; X is selected from the group consisting of oxygen, sulfur, and selenium; N is nitrogen; O is oxygen, and Z is a suitable aromatic component; an organic electroluminescent device comprised of an anode and a cathode, and an EL element positioned between the anode and the cathode, wherein said EL element has at least one light emitting layer containing a mixture of a fluorescent material and a metal chelate compound of the formula $$L_n\text{—}M^{+n} \quad (I)$$

wherein M represents a metal; n is a number of from 1 to 3, and L is a ligand of the formula

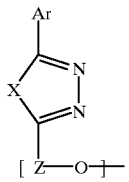

(II)

wherein Ar is an aryl; X is selected from the group consisting of oxygen, sulfur, and selenium; N is nitrogen; O is oxygen, and Z is a suitable aromatic component; an organic electroluminescent device wherein said metal is selected from the metals in Group (I), Group (II), or Group (III) of the Periodic Table; an organic electroluminescent device wherein said metal is zinc or beryllium; an organic electroluminescent device wherein X is oxygen or sulfur; an organic electroluminescent device wherein Z is an aromatic component selected from the group consisting of 1,2-phenylene, 1,2-naphthylene, and 2,3-naphthylene; an organic electroluminescent device wherein said metal chelate compound is selected from the group consisting of bis[2-(2-hydroxyphenyl)-5-phenyl-1,3,4-oxadiazolato]zinc; bis[2-(2-hydroxyphenyl)-5-phenyl-1,3,4-oxadiazolato] beryllium; bis[2-(2-hydroxy phenyl)-5-(1-naphthyl)-1,3,4-oxadiazolato]zinc; bis[2-(2-hydroxyphenyl)-5-(1-naphthyl)-1,3,4-oxadiazolato]beryllium; bis[5-biphenyl-2-(2-hydroxphenyl)-1,3,4-oxadiazolato]zinc; bis[5-biphenyl-2-(2-hydroxyphenyl)-1,3,4-oxadiazolato]beryllium; bis[2-(2-hydroxyphenyl)-5-p-tolyl-1,3,4-oxadiazolato]zinc; bis[2-(2-hydroxyphenyl)-5-p-tolyl-1,3,4-oxadiazolato]beryllium; bis[5-(p-tert-butylphenyl)-2-(2-hydroxyphenyl)-1,3,4-oxadiazolato]zinc; bis[5-(p-tert-butylphenyl)-2-(2-hydroxyphenyl)-1,3,4-oxadiazolato]beryllium; bis[2-(2-hydroxyphenyl)-5-(3-fluorophenyl)-1,3,4-oxadiazolato] zinc; bis[2-(2-hydroxyphenyl)-5-(4-fluorophenyl)-1,3,4-oxadiazolato]zinc; bis[2-(2-hydroxyphenyl)-5-(4-fluorophenyl)-1,3,4-oxadiazolato]beryllium; bis[5-(4-chlorophenyl)-2-(2-hydroxyphenyl)-1,3,4-oxadiazolato] zinc; bis[2-(2-hydroxyphenyl)-5-(4-methoxyphenyl)-1,3,4-oxadiazolato]zinc; bis[2-(2-hydroxy-4-methylphenyl)-5-phenyl-1,3,4-oxadiazolato]zinc; bis[2-α-(2-hydroxynaphthyl)-5-phenyl-1,3,4-oxadiazolato]zinc; bis[2-(2-hydroxyphenyl)5-p-pyridyl-1,3,4-oxadiazolato]zinc; bis[2-(2-hydroxyphenyl)-5-p-pyridyl-1,3,4-oxadiazolato] beryllium; bis[2-(2-hydroxyphenyl)-5-(2-thiophenyl)-1,3,4-oxadiazolato]zinc; bis[2-(2-hydroxyphenyl)-5-phenyl-1,3,4-thiadiazolato]zinc; bis[2-(2-hydroxyphenyl)-5-phenyl-1,3,4-thiadiazolato]beryllium; bis[2-(2-hydroxyphenyl)-5-(1-naphthyl)-1,3,4-thiadiazolato]zinc; and bis[2-(2-hydroxyphenyl)-5-(1-naphthyl)-1,3,4-thiadiazolato] beryllium; an organic electroluminescent device wherein said metal chelate compound is selected from the group consisting of bis[2-(2-hydroxyphenyl)-5-phenyl-1,3,4-oxadiazolato]zinc; bis[2-(2-hydroxyphenyl)-5-phenyl-1,3, 4-oxadiazolato]beryllium; bis[2-(2-hydroxyphenyl)-5-(1-naphthyl)-1,3,4-oxadiazolato]zinc; bis[2-(2-hydroxyphenyl)-5-(1-naphthyl)- 1,3,4-oxadiazolato] beryllium; bis[5-biphenyl-2-(2-hydroxyphenyl)-1,3,4-oxadiazolato]zinc; and bis[5-biphenyl-2-(2-hydroxyphenyl)-1,3,4-oxadiazolato]beryllium; an organic electroluminescent device wherein said EL element has at least one luminescent layer containing a mixture of said fluorescent material and said metal chelate compound of Formula (I), and wherein said fluorescent material possesses a bandgap no greater than that of said host component and a potential less negative than that of said host component; an organic electroluminescent device wherein said fluorescent material is a dye selected from the group consisting of coumarin, dicyanomethylene pyranes, polymethine, oxabenzanthrane, xanthene, pyrylium, carbostyl, perylene, quinacridone, and fused ring aromatic fluorescent dyes; an organic electroluminescent device wherein said fused ring aromatic fluorescent dye contains at least four fused rings; an organic electroluminescent device wherein said fused ring aromatic fluorescent dye is perylene or rubrene; an organic electroluminescent device wherein said quinacridone fluorescent dye is of the formula

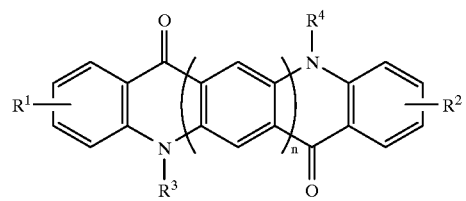

wherein $R^1$ and $R^2$ are independently hydrogen, alkyl, alkoxyl, aryl, fused aryl, or halogen; $R^3$ and $R^4$ are independently hydrogen, alkyl or aryl; and n=0, 1, 2, or 3; an organic electroluminescent device wherein $R^3$ and $R^4$ are independently alkyl or aryl; an organic electroluminescent device wherein said quinacridone fluorescent dye is selected from the group consisting of N,N'-dimethylquinacridone, N,N'-dimethyl-2-methyl quinacridone, N,N'-dimethyl-2,9-dimethylquinacridone, N,N'-dimethyl-2-chloroquinacridone, N,N'-dimethyl-2-fluoroquinacridone, and N,N'-dimethyl-1,2-benzoquinacridone; an organic electroluminescent device wherein the fluorescent material is present in a concentration of from about $10^{-3}$ to about 10 mole percent, based on the moles of said metal chelate; an organic electroluminescent device comprising in the following sequence an anode comprised of a layer of indium tin oxide having a thickness ranging from about 300 Å to about 1000 Å, a hole transporting layer comprised of a tertiary aromatic amine of a thickness ranging from about 100 Å to about 800 Å, said light emitting layer of a thickness ranging from about 100 Å to about 800 Å, and which layer is in contact with a cathode comprised of a magnesium/silver alloy or a lithium/aluminum alloy with a thickness ranging from about 100 Å to about 2,000 Å; an organic electroluminescent device further containing a buffer layer of from about 30 nanometers to about 200 nanometers situated between the anode and the hole transporting layer; an organic electroluminescent device wherein said buffer layer is comprised of a porphyrinic compound; an organic electroluminescent device wherein said buffer layer is comprised of an aromatic tertiary amine having an ionization potential between the anode work function and the ionization potential of the hole transporting layer; an organic electroluminescent device wherein said buffer layer is comprised of a conductive polymer selected from the group consisting of polyaniline, polypyrrol, and poly(phenylene vinylene); an organic electroluminescent device further containing an electron transporting layer of from about 100 Å to about 800 Å situated between the light emitting layer and the cathode; an organic electroluminescent device wherein said electron transporting layer is comprised of a metal complex of 8-hydroxyquinoline; an organic electroluminescent device wherein said electron transporting layer is comprised of a metal complex of 8-quinolinethiol; and a composition wherein Z possesses from about 6 to about 30 carbon atoms.

Illustrative examples of the supporting substrate include polymeric components, glass and the like, polyesters like MYLAR®, polycarbonates, polyacrylates, polymethacrylates, polysulfones, quartz, and the like. Other substrates can also be selected provided the material chosen can effectively support the other layers, and that it does not interfere with the device functional performance. The thickness of the substrate can be, for example, from about 25 to about 1,000 microns or more, and for example, from about 50 to about 500 depending, for example, on the structural demands of the device.

Examples of the anode which is contiguous to the substrate, include positive charge injecting electrodes including metal oxides such as indium tin oxide, tin oxide, gold, platinum, or other materials such as electrically conductive carbon, π-conjugated polymers such as polyaniline, polypyrrole, and the like, with a work function equal to, or greater than about 4 electron volts, and more specifically, from about 4 to about 6 electron volts. The thickness of the anode can range from about 10 to about 5,000 Å with the preferred range being dictated by the optical constants of the anode material. One preferred range of thickness is from about 20 to about 1,000 Angstroms (Å).

The buffer layer illustrated herein is optional. The functions of this layer are to facilitate efficient and uniform injection of holes from the anode, and to improve the adhesion between the anode and the organic hole transporting layer, thus further improving the device operation stability. Useful examples of buffer layer materials include any suitable hole transporting materials, such as porphyrin derivatives disclosed in U.S. Pat. No. 4,356,429, tertiary aromatic amines and the like, and conductive materials such as polyaniline and its acid-doped forms, polypyrrole, poly (phenylene vinylene), and known semiconductive organic materials. The disclosures of each of these two patents are totally incorporated herein by reference. Representative examples of porphyrin derivatives are porphyrin; 1,10,15, 20-tetraphenyl-21H,23H-porphyrin copper (II); copper phthalocyanine, copper tetramethyl phthalocyanine; zinc phthalocyanine; titanium oxide phthalocyanine; magnesium phthalocyanine; and the like. Specific examples of tertiary arylamines employed in the buffer layer are polynuclear aromatic tertiary amines comprised of 4,4',4"-tris (diarylamino) triphenylamines such as 4,4',4"-tris(phenyl-m-tolylamino)triphenylamines. The buffer layer can be prepared by forming one of the above compounds into thin film a known methods, such as vapor deposition or spin-coating. The thickness of buffer layer thus formed is not particularly limited, and can be in a range of from about 1 nanometer to about 1 micron, and preferably from about 30 nanometers to about 500 nanometers.

The hole transporting layer 5 is formed of a layer of one, two or more hole transporting materials with a thickness ranging from about 50 to about 2,000 Å, and preferably from about 400 to 1,000 Å. Any conventional suitable hole transporting materials may be selected for forming this layer. A preferred class of hole transporting materials is the aromatic tertiary amines such as those disclosed in U.S. Pat. No. 4,539,507, the disclosure of which is totally incorporated herein by reference. Representative examples of aromatic tertiary amines are bis(4-dimethylamino-2-methylphenyl)phenylmethane, N,N,N-tri(p-tolyl)amine, 1,1-bis(4-di-p-tolylaminophenyl)cyclohexane, 1,1-bis(4-di-p-tolylaminophenyl)-4-phenyl cyclohexane, N,N'-diphenyl-N,N'-bis(3-methylphenyl)-1,1'-biphenyl-4,4'-diamine, N,N'-diphenyl-N,N'-bis(3-methylphenyl)-1,1'-biphenyl-4,4'-diamine, N,N'-diphenyl-N,N'-bis(4-methoxyphenyl)-1,1'-biphenyl-4,4'-diamine, N,N,N',N'-tetra-p-tolyl-1,1'-biphenyl-4,4'-diamine, N,N'-di-1-naphthyl-N,N'-diphenyl-1,1'-biphenyl-4,4'-diamine, and the like. Another class of aromatic tertiary amines selected for the hole transporting layer is polynuclear aromatic amines, such as N,N-bis-[4'-(N-phenyl-N-m-tolylamino)-4-biphenylyl]aniline; N,N-bis-[4'-(N-phenyl-N-m-tolylamino)-4-biphenylyl]-m-toluidine; N,N-bis-[4'-(N-phenyl-N-m-tolylamino)-4-biphenylyl]-p-toluidine; N,N-bis-[4'-(N-phenyl-N-p-tolylamino)-4-biphenylyl]aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-(N-phenyl-N-p-chlorophenylamino)-4-biphenylyl]-m-toluidine; N,N-bis-[4'-(N-phenyl-N-m-chlorophenylamino)-4-biphenylyl]-m-toluidine; N,N-bis-[4'-(N-phenyl-N-m-chlorophenylamino)-4-biphenylyl]-p-toluidine; N,N-bis-[4'-(N-phenyl-N-m-tolylamino)-4-biphenylyl]-p-chloroaniline; N,N-bis-[4'-(N-phenyl-N-p-tolylamino)-4-biphenylyl]-m-chloroaniline; N,N-bis-[4'-(N-phenyl-N-m-tolylamino)-4-biphenylyl-1-aminonaphthalene and the like.

In the EL device of the present invention, the light emitting layer 6 is formed of luminescent compositions comprised of a mixture of a fluorescent dopant material and a luminescent chelate compound of Formula (I)

wherein M represents a metal, n is a number of from 1 to 3, and L is a ligand as essentially represented by Formula (II)

wherein the substituents are as indicated herein, for example Ar is aryl containing, for example, 6 to about 30 carbon atoms or an aromatic heterocyclic group of, for example, pyridyl, quinolyl, thienyl and the like; X is selected from the group consisting of oxygen, sulfur, and selenium; N is nitrogen, O is oxygen, and Z is a suitable aromatic component, such as 1,2-phenylene, 1,2-naphthylene, 2,3-naphthylene, 3,4-pyridinediyl, 3,4-quinolinediyl, the substituted analogs thereof with the substituents being preferably alkyl with 1 to about 5 carbon atoms, phenyl, aryl with a substituent of halogen, alkyl or alkoxy groups with 1 to 5 carbons, halogen alkoxy groups containing 1 to 3 carbon atoms, a carboxy group, a cyano group, and the like.

The metal ion included in Formula (I) may be monovalent, divalent, or trivalent. Specific examples of metal ions include those which are capable of forming a stable chelate compound with the ligand as illustrated in Formula (II), examples of metals being lithium, sodium, beryllium, magnesium, zinc, aluminum and the like, and preferably beryllium and zinc.

Illustrative examples of the ligand represented by Formula (II) include the following:

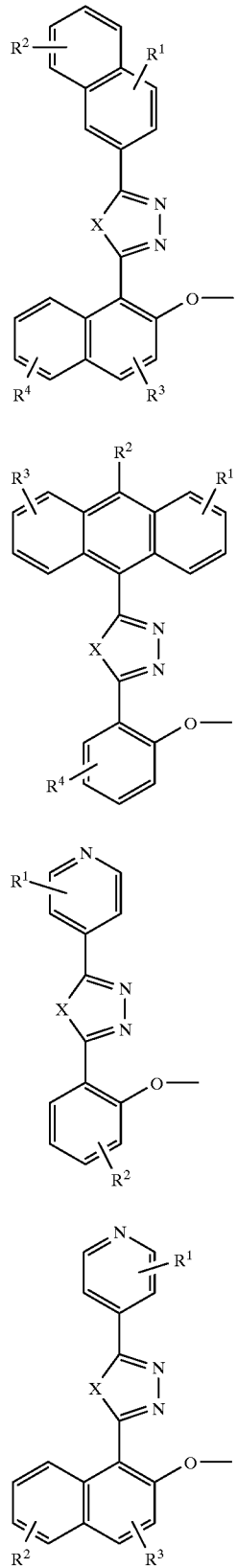

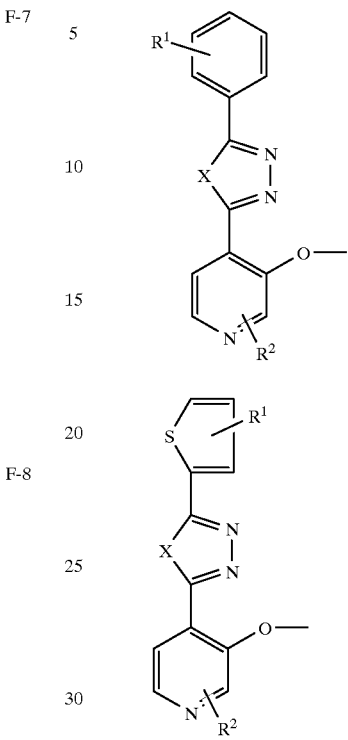

wherein the substituents are as illustrated herein, and more specifically, wherein X is an atom selected from the group consisting of oxygen, sulfur, and selenium; N is nitrogen, O is oxygen, $R^1$ to $R^4$ are suitable substituents as indicated herein, such as being independently selected from the group consisting of alkyl groups, preferably with 1 to about 5 carbon atoms, aryl, such as phenyl, aryl groups with a substituent of halogen atom, alkyl, or alkoxy with preferably 1 to 5 carbons, halogen, carboxy, cyano, and the like.

Illustrative examples of metal chelate compounds include bis[2-(2-hydroxyphenyl)-5-phenyl-1,3,4-oxadiazolato]zinc; bis[2-(2-hydroxy phenyl)-5-phenyl-1,3,4-oxadiazolato] beryllium; bis[2-(2-hydroxyphenyl)-5-(1-naphthyl)-1,3,4-oxadiazolato]zinc; bis[2-(2-hydroxyphenyl)-5-(1-naphthyl)-1,3,4-oxadiazolato]beryllium; bis[5-biphenyl-2-(2-hydroxyphenyl)-1,3,4-oxadiazolato]zinc; bis[5-biphenyl-2-(2-hydroxyphenyl)-1,3,4-oxadiazolato]beryllium; bis(2-hydroxyphenyl)-5-phenyl-1,3,4-oxadiazolato]lithium; bis[2-(2-hydroxyphenyl)-5-p-tolyl-1,3,4-oxadiazolato]zinc; bis[2-(2-hydroxyphenyl)5-p-tolyl-1,3,4-oxadiazolato]beryllium; bis[5-(p-tert-butylphenyl)-2-(2-hydroxyphenyl)-1,3,4-oxadiazolato]zinc; bis[5-(p-tert-butylphenyl)-2-(2-hydroxyphenyl)-1,3,4-oxadiazolato]beryllium; bis[2-(2-hydroxyphenyl)-5-(3-fluorophenyl)-1,3,4-oxadiazolato]zinc; bis[2-(2-hydroxyphenyl)-5-(4-fluorophenyl)-1,3,4-oxadiazolato]zinc; bis[2-(2-hydroxyphenyl)-5-(4-fluorophenyl)-1,3,4-oxadiazolato]beryllium; bis[5-(4-chlorophenyl)-2-(2-hydroxyphenyl)-1,3,4-oxadiazolato]zinc; bis[2-(2-hydroxyphenyl)-5-(4-methoxyphenyl)-1,3,4-oxadiazolato]zinc; bis[2-(2-hydroxy-4-methylphenyl)-5-phenyl-1,3,4-oxadiazolato]zinc; bis[2-α-(2-hydroxynaphthyl)-5-phenyl-1,3,4-oxadiazolato]zinc; bis[2-(2-hydroxyphenyl)-5-p-pyridyl-1,3,4-oxadiazolato]zinc; bis[2-(2-hydroxyphenyl)-5-p-pyridyl-1,3,4-oxadiazolato]beryllium; bis[2-(2-hydroxyphenyl)-5-(2-thiophenyl)-1,3,4- oxadiazolato]zinc; bis[2-(2-hydroxyphenyl)-5-phenyl-1,3,4-thiadiazolato]zinc; bis[2-(2-hydroxy phenyl)-5-phenyl-1,3,4-thiadiazolato]beryllium; bis[2-(2-hydroxyphenyl)-5-(1-naphthyl)-1,3,4-thiadiazolato]zinc; bis[2-(2-hydroxyphenyl)-5-(1-naphthyl)-1,3,4-thiadiazolato] beryllium, and the like.

The chelate compounds illustrated in Formula (I) are capable of emitting light in response to hole and electron recombination. By mixing with this component a small amount of a fluorescent material capable of emitting light in response to hole-electron recombination, improved device performance characteristics, such as emission hue and electroluminescent efficiency, may be achieved. The fluorescent material is present in an amount of, for example, from about 0.01 to about 10 weight percent, and preferably from about 1 to about 5 weight percent of the chelate layer. Examples of fluorescent materials which can be employed in the EL devices of the present invention include those capable of being blended with the host chelate material to form a common phase. Although any convenient techniques for dispersing the fluorescent agents in the host materials can be selected, the preferred technique is by vacuum vapor deposition wherein both the fluorescent agent and the host material can be simultaneously deposited. One preferred class of fluorescent materials are fluorescent dyes. Illustrative examples of fluorescent dyes are disclosed in U.S. Pat. No. 4,769,292, the disclosure of which is totally incorporated herein by reference, and include known compounds, such as coumarin dyes, like 7-diethylamino-4-methylcoumarin, 4,6-dimethyl-7-ethylaminocoumarin, 4-methylumbelliferone, and the like, fluorescent 4-dicyanomethylene-4H-pyrans, such as 4-(dicyanomethlene)2-methyl-6-(p-dimethylaminostyryl)-4H-pyran and the like, polymethine dyes such as cyanines, merocyanines, complex cyanines and merocyanines, oxonals, hexioxonols, styryls, merostyryls, streptocyanines and the like, oxobenzanthracene dyes, xanthene dyes including rhodamine dyes such as [9-(o-carboxyphenyl)-6-(diethylamino)-3H-xanthen-3-ylidene]diethyl ammonium, sulforhodamine B and the like. Another specially preferred class of fluorescent materials are quinacridone dyes. Illustrative examples of quinacridone dyes include quinacridone, 2-methylquinacridone, 2,9-dimethylquinacridone, 2-chloroquinacridone, 2-fluoroquinacridone, 1,2-benzoquinacridone, N,N'-dimethylquinacridone, N,N'-dimethyl-2-methylquinacridone, N,N'-dimethyl-2,9-dimethylquinacridone, N,N'-dimethyl-2-chloroquinacridone, N,N'-dimethyl-2-fluoroquinacridone, N,N'-dimethyl-1,2-benzoquinacridone, and the like. Also another preferred class of fluorescent materials are fused ring fluorescent dyes. Examples of the fused ring fluorescent dyes include perylene, rubrene, anthracene, coronene, phenanthrecene, pyrene and the like, as illustrated in U.S. Pat. No. 3,172,862, the disclosure of which is totally incorporated herein by reference. Also, fluorescent materials used as a dopant include butadienes, such as 1,4-diphenylbutadiene and tetraphenylbutadiene, and stilbenes, and the like as illustrated in U.S. Pat. Nos. 4,356,429 and 5,516,577, the disclosures of which are totally incorporated herein by reference.

The thickness of the light emitting layer is not particularly limited, and can range from about 50 to about 2,000 Å, and preferably from about 100 to about 1,000 Å.

The electron transporting layer 7 is not necessarily required for the present device, but is optionally and preferably used for the purpose of improving the electron injection characteristics of the EL devices and the emission uniformity. The thickness of this layer can be from about 50 to about 2,000 Å, and preferably from about 400 to about 1,000 Å. Illustrative examples of electron transporting compounds, which can be utilized in this layer, include the metal chelates of Formula (I), metal oxinoid compounds and the chelate compounds of 10-hydroxybenzo[h]quinoline and its derivatives. Illustrative examples include tris(8-hydroxyquinolinate) aluminum, tris(8-hydroxyquinolinate) gallium, bis(8-hydroxyquinolinate) magnesium, bis(8-hydroxyquinolinate) zinc, tris(5-methyl-8-hydroxyquinolinate)aluminum, tris(7-propyl-8-quinolinolate)aluminum, bis[benzo{f}-8-quinolinate]zinc, bis(10-hydroxybenzo[h]quinolinate)beryllium, and the like. Another class of preferred electron injecting compounds are the metal thioxinoid compounds, illustrated in copending application U.S. Ser. No. 807,488, the disclosure of which is totally incorporated herein by reference. Illustrative examples of metal thioxinoid compounds include bis(8-quinolinethiolato)zinc, bis(8-quinolinethiolato)cadmium, tris(8-quinolinethiolato)gallium, tris(8-quinolinethiolato) indium, bis(5-methylquinolinethiolato)zinc, tris(5-methylquinolinethiolato)gallium, tris(5-methylquinolinethiolato)indium, bis(5-methylquinolinethiolato)cadmium, bis(3-methylquinolinethiolato)cadmium, bis(5-methylquinolinethiolato)zinc, bis[benzo{f}-8-quinolinethiolato]zinc, bis[3-methylbenzo{f}-8-quinolinethiolato]zinc, bis[3,7-dimethylbenzo{f}-8-quinolinethiolato]zinc, and the like.

The cathode 6 can be comprised of any suitable metal, including high, for example from about 4.0 eV to about 6.0 eV, or low work function metals, such as metals with, for example, an eV of from about 2.5 eV to about 4.0 eV (electron volts). The cathode can be derived from a combination of a low work function metal (less than about 4 eV) and at least one other metal. Effective proportions of the low work function metal to the second or other metal are from less than about 0.1 percent to about 99.9 percent by weight. Illustrative examples of low work function metals include alkaline metals, such as lithium or sodium, Group 2A or alkaline earth metals, such as beryllium, magnesium, calcium, or barium, and Group III metals including rare earth metals and the actinide group metals such as scandium, yettrium, lanthanum, cerium, europium, terbium, or actinium. Lithium, magnesium and calcium are the preferred low work function metals.

The thickness of cathode 6 ranges from, for example, about 10 to about 5,000 Å. The Mg:Ag cathodes of U.S. Pat. No. 4,885,211, the disclosure of which is totally incorporated herein by reference, constitute one preferred cathode construction. Another preferred cathode construction is described in U.S. Pat. No. 5,429,884, wherein the cathodes are formed from lithium alloys with other high work function metals such as aluminum and indium.

Both anode 3 and cathode 6 of the EL devices of the present invention can be of any suitable convenient form. A thin conductive layer can be coated onto a light transmissive substrate, for example a transparent or substantially transparent glass plate or plastic film. Thus, the EL device can include a light transmissive anode 3 formed from tin oxide or indium tin oxide coated on a glass plate. Also, very thin, for example less than about 200 Å, and more specifically, from about 50 Å to about 150 Å light-transparent metallic anodes can be selected, such as gold, palladium, and the like. In addition, transparent or semi-transparent thin layers of conductive carbon or conjugated polymers, such as polyaniline, polypyrrole and the like, and combination thereof with indium tin oxide, tin oxide, and other transparent electrode materials, can be selected as anodes. Any light transmissive polymeric film, such as polycarbonates, can be selected as the substrate.

The following Examples are provided to further define various aspects of the present invention, it being noted that these Examples are intended to illustrate and not limit the scope of the present invention.

EXAMPLE I

An organic EL device was prepared in the following manner:

1. A 500 Å indium tin oxide (ITO) anode coated glass substrate, the thickness of the glass substrate being about 1 millimeter, was cleaned with a commercial detergent, rinsed with deionized water and dried in a vacuum oven at 60° C. for 1 hour. Immediately before use, the glass was treated with UV ozone for 0.5 hour.

2. The ITO anode coated on the glass substrate was then placed in a vacuum deposition chamber. The deposition rate and layer thickness were controlled by an Inficon Model IC/5 controller. Under a pressure of about $5 \times 10^{-6}$ torr, the hole transport compound, N,N'-1-naphthyl-N,N'-diphenyl-1,1'-biphenyl-4,4'-diamine was evaporated from an electrically heated tantalum boat to deposit an 80 nanometers thick hole transporting layer on the ITO glass at a rate of 0.6 nanometer/second.

3. Onto the hole transporting layer was deposited the metal chelate an 80 nanometer light emitting layer through simultaneous evaporation of bis[2-(hydroxyphenyl)-5-1-naphthyl-1,3,4-oxadiazolate]beryllium at a rate of 0.6 nanometer/second and 3 weight percent or parts of a fluorescent material of rubrene at a rate of 0.03 nanometer/second from two independently controlled tantalum boats.

4. A 100 nanometer cathode of a magnesium silver alloy was then deposited at a total deposition rate of 0.5 nanometer/second onto the electron injecting and transporting layer 3 above by the simultaneous evaporation from two independently controlled tantalum boats containing Mg and Ag, respectively. A typical composition was 9:1 in atomic ratio of Mg to Ag. Finally, a 200 nanometer silver layer was overcoated on the Mg:Ag cathode for the primary purpose of protecting the reactive Mg from ambient moisture.

The device as prepared above was retained in a dry box which was continuously purged with nitrogen gas. Its performance was assessed by measuring its current-voltage characteristics and light output under a direct current measurement. The current-voltage characteristics were determined with a Keithley Model 238 High Current Source Measure Unit. The ITO electrode was always connected to the positive terminal of the current source. At the same time, the light output from the device was monitored by a silicon photodiode.

In operation, when a positive bias voltage was applied to the ITO electrode, the fabricated device emitted greenish yellow light with a peak emission at 560 nanometers. The emission spectrum recorded from this device was similar to the electroluminescent spectrum of rubrene. The device provided a light intensity of 3,200 cd/m² at 12 volts. In a stability test with a constant current of 25 mA/cm², the device provided an initial light output of 950 cd/m². The light intensity degraded slowly, with a 50 percent reduction after 250 hours of continuous operation.

For comparison, a controlled EL device was fabricated in a similar manner except that no fluorescent material of rubrene was used. The device emitted blue light with a peak emission at 480 nanometers and provided a light intensity of 750 cd/cm² at 14 volts indicating, for example, that the presence of rubrene dopant enables tuning and improving the emission color from 480 nanometers to 560 nanometers.

EXAMPLE II

An organic EL device was prepared in accordance with Example I except that perylene was utilized as the fluorescent material in place of rubrene. When a positive bias voltage was applied to the ITO electrode, the fabricated device emitted blue light with a peak emission at 480 nanometers. The emission spectrum recorded from this device was substantially identical to the electroluminescent spectrum of perylene. The device provided a light intensity of 1,700 cd/m² at 14 volts. In a stability test with a constant current of 25 mA/cm², the device provided an initial light output of 450 cd/m². The light intensity degraded slowly, with a 50 percent reduction after 350 hours of continuous operation.

EXAMPLE III

An organic EL device was prepared in accordance with Example I except that N,N'-dimethylquinacridone was utilized as the fluorescent material in place of rubrene, and evaporated at a rate of 0.006 nanometer/second When a positive bias voltage was applied to the ITO electrode, the fabricated device emitted green light with a peak emission at 545 nanometers. The emission spectrum recorded from this device was substantially identical to the electroluminescent spectrum of N,N'-dimethylquinacridone. The device provided a light intensity of 5,100 cd/m² at 12 volts. In a stability test with a constant current of 25 mA/cm², the device provided an initial light output of 780 cd/m². The light intensity degraded slowly, with a 50 percent reduction after 260 hours of continuous operation.

EXAMPLE IV

An organic EL device was prepared in accordance with Example I except that 2,9-dimethyl-N,N'-dimethylquinacridone was utilized as the fluorescent material in place of rubrene, and evaporated at a rate of 0.006 nanometer/second. When a positive bias voltage was applied to the ITO electrode, the fabricated device emitted yellowish green light with a peak emission at 550 nanometers. The emission spectrum recorded from this device was substantially identical to the electroluminescent spectrum of 2,9-dimethyl-N,N'-dimethylquinacridone. The device provided a light intensity of 6,300 cd/M² at 12 volts. In a stability test with a constant current of 25 mA/cm², the device provided an initial light output of 980 cd/M². The light intensity degraded slowly, with a 50 percent reduction after 210 hours of continuous operation.

EXAMPLE V

An organic EL device was prepared in accordance with Example I except that bis[2-(hydroxyphenyl)-5-phenyl-1,3,4-oxadiazolate]beryllium was utilized in place of bis[2-(hydroxyphenyl)-5-1-naphthyl-1,3,4-oxadiazolate]beryllium. When a positive bias voltage was applied to the ITO electrode, this device emitted greenish yellow light with a peak emission at 560 nanometers and provided a light intensity of 980 cd/cm² at 16 volts. In a stability test with a constant current of 25 mA/cm², the device provided an initial light output of 650 cd/m². The light intensity degraded slowly, with a 50 percent reduction after 210 hours of continuous operation.

Other modifications of the present invention will occur to those of ordinary skill in the art subsequent to a review of the present application. These modifications and equivalents thereof are intended to be included within the scope of the present invention.

What is claimed is:

1. A luminescent composition comprised of a mixture containing a fluorescent material and a metal chelate compound of the formula $$L_n\text{—}M^{+n} \quad (I)$$

wherein M represents a metal, n is a number of from 1 to 3, and L is a ligand of the formula

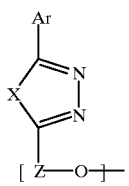

(II)

wherein Ar is an aryl; X is selected from the group consisting of oxygen, sulfur, and selenium; N is nitrogen; O is oxygen, and Z is a suitable aromatic component of phenylene, naphthalene, pyridinediyl, or quinolinediyl, and said fluorescent material is a dye selected from the group consisting of coumarin, dicyanomethylene pyranes, polymethine, oxabenzanthrane, xanthene, pyrylium, carbostyl, perylene, quinacridone, and a fused ring aromatic fluorescent dye.

2. An organic electroluminescent device comprised of an anode and a cathode, and an EL element positioned between the anode and the cathode, wherein said EL element has at least one light emitting layer containing a mixture of a fluorescent material and a metal chelate compound of the formula $$L_n\text{—}M^{+n} \quad (I)$$

wherein M represents a metal; n is a number of from 1 to 3, and L is a ligand of the formula

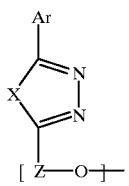

(II)

wherein Ar is an aryl; X is selected from the group consisting of oxygen, sulfur, and selenium; N is nitrogen; O is oxygen, and Z is a component of phenylene, naphthalene, pyridinediyl, or quinolinediyl, and said fluorescent material is a dye selected from the group consisting of coumarin, dicyanomethylene pyranes, polymethine, oxabenzanthrane, xanthene, pyrylium, carbostyl, perylene, quinacridone, and a fused ring aromatic fluorescent dye.

3. An organic electroluminescent device in accordance with claim 2 wherein said metal is selected from the metals in Group (I), Group (II), or Group (III) of the periodic Table.

4. An organic electroluminescent device in accordance with claim 2 wherein said metal is zinc or beryllium.

5. An organic electroluminescent device in accordance with claim 2 wherein X is oxygen or sulfur.

6. An organic electroluminescent device in accordance with claim 2 wherein Z is an aromatic component selected from the group consisting of 1,2-phenylene, 1,2-naphthylene, and 2,3-naphthylene.

7. An organic electroluminescent device in accordance with claim 2 wherein said metal chelate compound is selected from the group consisting of bis[2-(2-hydroxyphenyl)-5-phenyl-1,3,4-oxadiazolato]zinc; bis[2-(2-hydroxyphenyl)-5-phenyl-1,3,4-oxadiazolato]beryllium; bis[2(2-hydroxyphenyl)-5-(1-naphthyl)-1,3,4-oxadiazolato]zinc; bis[2-(2-hydroxyphenyl)-5-(1-naphthyl)-1,3,4-oxadiazolato]beryllium; bis[5-biphenyl-2-(2-hydroxyphenyl)-1,3,4-oxadiazolato]zinc; bis[5-biphenyl-2-(2-hydroxyphenyl)-1,3,4-oxadiazolato]beryllium; bis[2-(2-hydroxyphenyl)-5-p-tolyl-1,3,4-oxadiazolato]zinc; bis[2-(2-hydroxyphenyl)-5-p-tolyl-1,3,4-oxadiazolato]beryllium; bis[5-(p-tert-butylphenyl)-2-(2-hydroxyphenyl)-1,3,4-oxadiazolato]zinc; bis[5-(p-tert-butylphenyl)-2-(2-hydroxyphenyl)-1,3,4-oxadiazolato]beryllium; bis[2-(2-hydroxyphenyl)-5-(3-fluorophenyl)-1,3,4-oxadiazolato]zinc; bis[2-(2-hydroxyphenyl)-5-(4-fluorophenyl)-1,3,4-oxadiazolato]zinc; bis[2-(2-hydroxyphenyl)-5-(4-fluorophenyl)-1,3,4-oxadiazolato]beryllium; bis[5-(4-chlorophenyl)-2-(2-hydroxyphenyl)-1,3,4-oxadiazolato]zinc; bis[2-(2-hydroxyphenyl)-5-(4-methoxyphenyl)-1,3,4-oxadiazolato]zinc; bis[2-(2-hydroxy-4-methylphenyl)-5-phenyl-1,3,4-oxadiazolato]zinc; bis[2-α-(2-hydroxynaphthyl)-5-phenyl-1,3,4-oxadiazolato]zinc; bis[2-(2-hydroxyphenyl)-5-p-pyridyl-1,3,4-oxadiazolato]zinc; bis[2-(2-hydroxyphenyl)-5-p-pyridyl-1,3,4-oxadiazolato]beryllium; bis[2-(2-hydroxyphenyl)-5-(2-thiophenyl)-1,3,4-oxadiazolato]zinc; bis[2-(2-hydroxyphenyl)-5-phenyl-1,3,4-thiadiazolato]zinc; bis[2-(2-hydroxyphenyl)-5-phenyl-1,3,4-thiadiazolato]beryllium; bis[2-(2-hydroxyphenyl)-5-(1-naphthyl)-1,3,4-thiadiazolato]zinc; and bis[2-(2-hydroxyphenyl)-5-(1-naphthyl)-1,3,4-thiadiazolato]beryllium.

8. An organic electroluminescent device in accordance with claim 3 wherein said metal chelate compound is selected from the group consisting of bis[2-(2-hydroxyphenyl)-5-phenyl-1,3,4-oxadiazolato]zinc; bis[2-(2-hydroxyphenyl)-5-phenyl-1,3,4-oxadiazolato]beryllium; bis[2-(2-hydroxyphenyl)-5-(1-naphthyl)-1,3,4-oxadiazolato]zinc; bis[2-(2-hydroxyphenyl)-5-(1-naphthyl)-1,3,4-oxadiazolato]beryllium; bis[5-biphenyl2-(2-hydroxyphenyl)-1,3,4-oxadiazolato]zinc; and bis[5-biphenyl-2-(2-hydroxyphenyl)-1,3,4-oxadiazolato]beryllium.

9. An organic electroluminescent device in accordance with claim 2 wherein said EL element has at least one luminescent layer containing a mixture of said fluorescent material and said metal chelate compound of Formula (I), and wherein said fluorescent material possesses a bandgap no greater than that of said host component and a potential less negative than that of said host component.

10. An organic electroluminescent device in accordance with claim 2 wherein said fluorescent material is a dye selected from the group consisting of coumarin, dicyanomethylene pyranes, polymethine, oxabenzanthrane, xanthene, pyrylium, carbostyl, perylene, quinacridone, and a fused ring aromatic fluorescent dye.

11. An organic electroluminescent device in accordance with claim 2 wherein said fused ring aromatic fluorescent dye contains at least four fused rings.

12. An organic electroluminescent device in accordance with claim 11 wherein said fused ring aromatic fluorescent dye is perylene or rubrene.

13. An organic electroluminescent device in accordance with claim 2 wherein said quinacridone fluorescent dye is of the formula

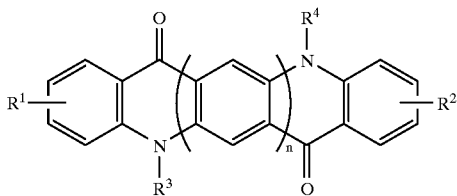

wherein $R^1$ and $R^2$ are independently hydrogen, alkyl, alkoxyl, aryl, fused aryl, or halogen; $R^3$ and $R^4$ are independently hydrogen, alkyl or aryl; and n=0, 1, 2, or 3.

14. An organic electroluminescent device in accordance with claim 13 wherein $R^3$ and $R^4$ are independently alkyl or aryl.

15. An organic electroluminescent device in accordance with claim 13 wherein said quinacridone fluorescent dye is selected from the group consisting of N,N'-dimethylquinacridone, N,N'-dimethyl-2-methylquinacridone, N,N'-dimethyl-2,9-dimethylquinacridone, N,N'-dimethyl-2-chloroquinacridone, N,N'-dimethyl-2-fluoroquinacridone, and N,N'-dimethyl-1,2-benzoquinacridone.

16. An organic electroluminescent device in accordance with claim 10 wherein the fluorescent material is present in a concentration of from about $10^{-3}$ to about 10 mole percent, based on the moles of said metal chelate.

17. An organic electroluminescent device in accordance with claim 2 comprising in the following sequence an anode comprised of a layer of indium tin oxide having a thickness ranging from about 300 Å to about 1,000 Å, a hole transporting layer comprised of a tertiary aromatic amine of a thickness ranging from about 100 Å to about 800 Å, said light emitting layer being of a thickness ranging from about 100 Å to about 800 Å, and which layer is in contact with a cathode comprised of a magnesium/silver alloy or lithium/aluminum alloy with a thickness ranging from about 100 Å to about 2,000 Å.

18. An organic electroluminescent device in accordance with claim 17 further containing a buffer layer of from about 30 nanometers to about 200 nanometers situated between the anode and the hole transporting layer.

19. An organic electroluminescent device in accordance with claim 18 wherein said buffer layer is comprised of a porphyrinic compound.

20. An organic electroluminescent device in accordance with claim 18 wherein said buffer layer is comprised of an aromatic tertiary amine having an ionization potential between the anode work function and the ionization potential of the hole transporting layer.

21. An organic electroluminescent device in accordance with claim 18 wherein said buffer layer is comprised of a conductive polymer selected from the group consisting of polyaniline, polypyrrol, and poly(phenylene vinylene).

22. An organic electroluminescent device in accordance with claim 17 further containing an electron transporting layer of from about 100 Å to about 800 Å situated between the light emitting layer and the cathode.

23. An organic electroluminescent device in accordance with claim 22 wherein said electron transporting layer is comprised of a metal complex of 8-hydroxyquinoline.

24. An organic electroluminescent device in accordance with claim 22 wherein said electron transporting layer is comprised of a metal complex of 8-quinolinethiol.

25. A composition in accordance with claim 1 wherein Z possesses from about 6 to about 30 carbon atoms.

26. A device in accordance with claim 2 wherein said anode is a metal oxide, or a polymer.

27. An electroluminescent device comprised of a supporting substrate, an anode, an organic hole transporting layer, an organic light emitting layer, and an electron transporting layer, and thereover a cathode wherein said light emitting layer is comprised of a metal chelate compound of the formula (II)

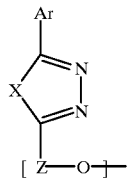

wherein Ar is an aryl; X is selected from the group consisting of oxygen, sulfur, and selenium; N is nitrogen; O is oxygen, and Z is a suitable aromatic component of phenylene, naphthalene, pyridinediyl, or quinolinediyl.

28. An electroluminescent device in accordance with claim 27 further containing a luminescent composition which contains a fluorescent material selected from the group consisting of coumarin, dicyanomethylene pyranes, polymethine, oxabenzanthrane, xanthene, pyrylium, carbostyl, perylene, quinacridone, and a fused ring aromatic fluorescent dye.

29. An electroluminescent device in accordance with claim 27 wherein said aryl contains from 6 to about 30 carbon atoms, and Z is 1,2-phenylene, 1,2-naphthylene, 2,3-naphthylene, 3,4-pyridinediyl, or 3,4-quinolinediyl.

30. An electroluminescent device in accordance with claim 27 wherein said metal chelate compound is selected from the group consisting of bis[2-(2-hydroxyphenyl)-5-phenyl-1,3,4-oxadiazolato]zinc; bis[2-(2-hydroxyphenyl)-5-phenyl-1,3,4-oxadiazolato]beryllium; bis[2-(2-hydroxyphenyl)-5-(1-naphthyl)-1,3,4-oxadiazolato]zinc; bis[2-(2-hydroxyphenyl)-5-(1-naphthyl)-1,3,4-oxadiazolato]beryllium; bis[5-biphenyl2-(2-hydrox phenyl)-1,3,4-oxadiazolato]zinc; bis[5-biphenyl-2-(2-hydroxyphenyl)-1,3,4-oxadiazolato]beryllium; bis[2-(2-hydroxyphenyl)-5-p-tolyl-1,3,4-oxadiazolato]zinc; bis[2-(2-hydroxyphenyl)-5-p-tolyl- 1,3,4-oxadiazolato]beryllium; bis[5-(p-tert-butylphenyl)-2-(2-hydroxyphenyl)-1,3,4-oxadiazolato]zinc; bis[5-(p-tert-butylphenyl)-2-(2-hydroxyphenyl)- 1,3,4-oxadiazolato]beryllium; bis[2-(2-hydroxyphenyl)-5-(3-fluorophenyl)-1,3,4-oxadiazolato]zinc; bis[2-(2-hydroxyphenyl)-5-(4-fluorophenyl)- 1,3,4-oxadiazolato]zinc; bis[2-(2-hydroxyphenyl)-5-(4-fluorophenyl)- 1,3,4-oxadiazolato]beryllium; bis[5-(4-chlorophenyl)-2-(2-hydroxyphenyl)- 1,3,4-oxadiazolato]zinc; bis[2-(2-hydroxyphenyl)-5-(4-methoxyphenyl)-1,3,4-oxadiazolato]zinc; bis[2-(2-hydroxy-4-methylphenyl)-5-phenyl-1,3,4-oxadiazolato]zinc; bis[2-α-(2-hydroxynaphthyl)-5-phenyl-1,3,4-oxadiazolato]zinc; bis[2-(2-hydroxyphenyl)-5-p-pyridyl-1,3,4-oxadiazolato]zinc; bis[2-(2-hydroxyphenyl)-5-p-pyridyl-1,3,4-oxadiazolato]beryllium; bis[2-(2-hydroxyphenyl)-5-(2-thiophenyl)-1,3,4-oxadiazolato]zinc; bis[2-(2-hydroxyphenyl)-5-phenyl-1,3,4-thiadiazolato]zinc; bis[2-(2-hydroxyphenyl)-5-phenyl-1,3,4-thiadiazolato]beryllium; bis[2-(2-hydroxyphenyl)-5-(1-naphthyl)-1,3,4-thiadiazolato]zinc; and bis[2-(2-hydroxyphenyl)-5-(1-naphthyl)-1,3,4-thiadiazolato]beryllium.

31. An electroluminescent device in accordance with claim 27 wherein said metal chelate is bis[2-(hydroxyphenyl)-5-1-naphthyl-1,3,4-oxadiazolate]beryllium.

32. An electroluminescent device in accordance with claim 31 wherein said transport is N,N'-1-naphthyl-N,N'-diphenyl-1,1'-biphenyl4,4'-diamine.

33. An electroluminescent device consisting essentially of supporting substrate, an anode, an organic hole transporting layer, an organic light emitting layer, and an electron transporting layer, and thereover a cathode wherein said light emitting layer is comprised of a metal chelate compound of the formula

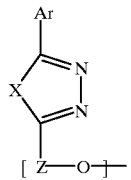

(II)

wherein Ar is an aryl; X is selected from the group consisting of oxygen, sulfur, and selenium; N is nitrogen; O is oxygen, and Z is a suitable aromatic component of phenylene, naphthalene, pyridinediyl, or quinolinediyl.

* * * * *